US006892273B1

(12) United States Patent
James et al.

(10) Patent No.: US 6,892,273 B1
(45) Date of Patent: May 10, 2005

(54) METHOD AND APPARATUS FOR STORING MASK VALUES IN A CONTENT ADDRESSABLE MEMORY (CAM) DEVICE

(75) Inventors: David V. James, Palo Alto, CA (US); Jagadecsan Raiamanickam, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 353 days.

(21) Appl. No.: 10/165,560

(22) Filed: Jun. 7, 2002

Related U.S. Application Data (60) Provisional application No. 60/343,973, filed on Dec. 27, 2001.

(51) Int. Cl.[7] .............................................. G06F 12/00
(52) U.S. Cl. ............................ 711/108; 711/108; 365/49
(58) Field of Search ................................ 711/108, 128; 365/49

(56) References Cited

U.S. PATENT DOCUMENTS

| | | | |
|---|---|---|---|
| 5,572,692 A | * 11/1996 | Murdoch et al. | ............... 711/5 |
| 5,586,288 A | 12/1996 | Dahlberg | |
| 5,621,773 A | 4/1997 | Varma et al. | |
| 6,081,440 A | * 6/2000 | Washburn et al. | ............. 365/49 |
| 6,181,698 B1 | * 1/2001 | Hariguchi | .................... 370/392 |
| 6,237,061 B1 | * 5/2001 | Srinivasan et al. | .......... 711/108 |
| 6,502,163 B1 | * 12/2002 | Ramankutty | ................. 711/108 |
| 6,505,270 B1 | * 1/2003 | Voelkel et al. | ............... 711/108 |

* cited by examiner

Primary Examiner—Matthew Kim
Assistant Examiner—Hetul Patel
(74) Attorney, Agent, or Firm—Bradley T. Sako (57) ABSTRACT

According to one embodiment, a method for storing content addressable memory (CAM) mask values may include storing mask values according to mask size in a mask register set (200). A mask register set (200) may include a number of locations arranged into regions (202, 204, 206 and 208). Each region (202, 204, 206 and 208) can store mask values of a different predetermined size.

19 Claims, 8 Drawing Sheets

| SHIFT | |
|---|---|
| SIZE | OP |
| 36A | 0 |
| 36B | 0 |
| 72 | 0 |
| 144 | < |
| 288 | << |
| 576 | <<< |

FIG. 6B

| BASE ADD | |
|---|---|
| SIZE | VALUE |
| 36A | 080 |
| 36B | 080 |
| 72 | 090 |
| 144 | 0A0 |
| 288 | 0C0 |
| 576 | 080 |

FIG. 6C

| CNT | |
|---|---|
| SIZE | # |
| 36A | 0 |
| 36B | 0 |
| 72 | 0 |
| 144 | 1 |
| 288 | 3 |
| 576 | 7 |

FIG. 6D

| MASK | |
|---|---|
| SIZE | # |
| 36A | 32-71 |
| 36B | 0-31 |
| 72 | NONE |
| 144 | NONE |
| 288 | NONE |
| 576 | NONE |

SEARCH REQUEST

FIG. 9D

SEARCH RESPONSE

METHOD AND APPARATUS FOR STORING MASK VALUES IN A CONTENT ADDRESSABLE MEMORY (CAM) DEVICE

This application claims the benefit of provisional application Ser. No. 60/343,973 filed Dec. 27, 2001.

TECHNICAL FIELD

The present invention relates to content addressable memory (CAM) devices and particularly to CAM devices that store mask values.

BACKGROUND OF THE INVENTION

Many conventional search engine systems typically include one or more search engine devices. A search engine device can include circuitry for performing one or more types of search operations. In a search operation, a comparand (or key) may be compared to multiple entries to see if all or a portion of the key matches an entry. After a search operation, a search engine may give a search result as an output. Typically a search result may include an "index" value, which may be used to access associated data or as associated data itself.

Search engine devices may take a variety of forms. As but a few of the possible examples, some search engine devices are based on particular types of content addressable memory (CAM) cells. Such CAM cells may include storage circuits integrated with compare circuits. An example of storage circuits may be static random access memory (SRAM) type cells or dynamic random access memory (DRAM) type cells. Alternate approaches to search engines may include random access memories (RAM) arrays, or the like, with separate matching circuits and/or processes.

A CAM may perform the matching functions described above by providing the ability to apply a search key or "comparand" to a table of stored data values. A CAM may then determine if any of the data values matches a given search key. A typical conventional search operation, along with a general architecture of a conventional CAM system will now be described in more detail.

Figure 10A:
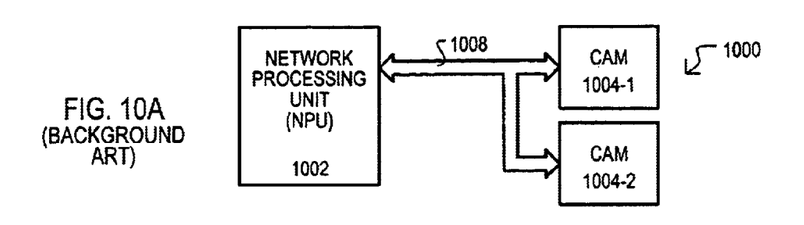
FIG. 10A is a block diagram of a conventional CAM system.

Referring to FIG. 10A, an example of a conventional CAM system is designated by the general reference number 1000. A conventional CAM system 1000 may include a network processor (NPU) 1002, and a number of CAM devices 1004-1 and 1004-2 that may be connected by control and data links or buses 1008.

Figure 10B:
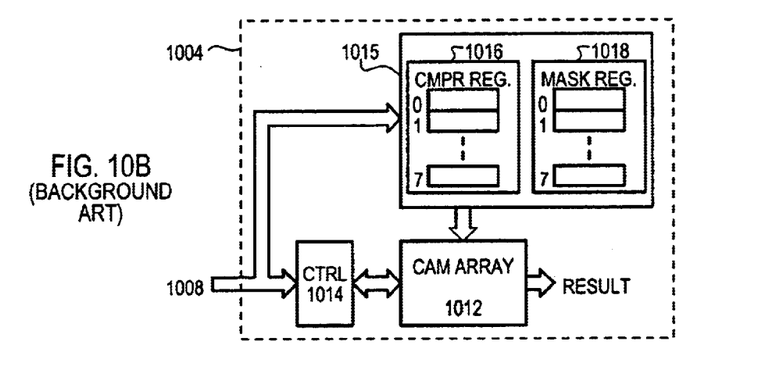
FIG. 10B is a block diagram of a conventional CAM device.

Referring now to FIG. 10B, an example of a CAM device 1004 is shown in more detail, and may include a CAM array 1012, CAM control circuits 1014, and register sets 1015. Register sets 1015 may include a comparand register (CMPR) set 1016 and a mask register set 1018.

A CAM array 1012 may contain any number of CAM storage cells. Data may be written to and/or read from such CAM storage cells. A CAM array 1012 may also support a search function, where a search key or "comparand" may be compared against data stored in any number of CAM entries. If the data of any CAM entry matches a comparand value, then a search hit may be indicated. Otherwise a search miss may be indicated.

CAM control circuits 1014 can take CAM control and data signals 1008 as inputs and generate signals for controlling the operation of a CAM array 1012.

A CMPR set 1016 may include storage locations for storing comparand values used for search operations. In the particular example of FIG. 10B, a CMPR set 1016 includes eight storage locations. Comparand values may be loaded into a location of a CMPR set 1016 by CAM control and data signals 1008. Comparand values may be saved within a CMPR set 1016 during a search. Such a saved comparand value may then be used in a subsequent search without an NPU, or the like, having to re-transmit the comparand value.

A mask register set 1018 may store a number of mask values that may be used in a compare operation. As is well understood, a mask value can mask selected bits of a comparand from a compare operation. Typically, one type of mask bit value indicates a mask operation, while another indicates a no-mask operation. More particularly, if a masking bit value is "1" a mask value of "0000 1111" would mask the first four bits of comparand from a compare operation, and include the last four bits in the compare operation.

Within a mask register set 1018, mask values may be stored at particular addressable register locations. Thus, particular mask values may be accessed by a mask register set address. Thus, a search operation may designate a mask register set address value rather than supply an entire mask value.

Having described an example of a CAM based system, as well as a CAM block, a conventional CAM search operation will now be described with reference to FIGS. 10A and 10B. To perform a search operation, an NPU 1002 may provide to a CAM device (1004-1 and 1004-2) a comparand value, a mask register address value within mask register set 1018, as well as the location within a comparand register set 1016 to store the comparand data. In this example, it will be assumed that a mask register address value of "0" is provided.

A mask value located at address 0 in a mask register set 1018 may be accessed for a compare operation. Such a mask value may then a mask a comparand value in a compare operation. Such masking may occur in a variety of ways. As but one example, for each non-masked bit, complementary comparand bit lines may be driven to opposite logic levels. In contrast, for each masked bit, complementary comparand bit lines may be driven to a same logic levels. Such comparand bit lines may then be applied to CAM storage locations within a CAM array 1012.

If any of the values stored in a CAM array 1012 matches the masked comparand value, a search operation can generate a search "hit." Various actions may be taken in response to a search hit. As one example, an index value may be generated for the CAM storage location that matches a comparand value. Further, a search result may be communicated back to a NPU 1002 as a RESULT. It is noted that in a conventional case, a comparand register 1016 location corresponding to a matching comparand value may then be free for use.

Figure 11:
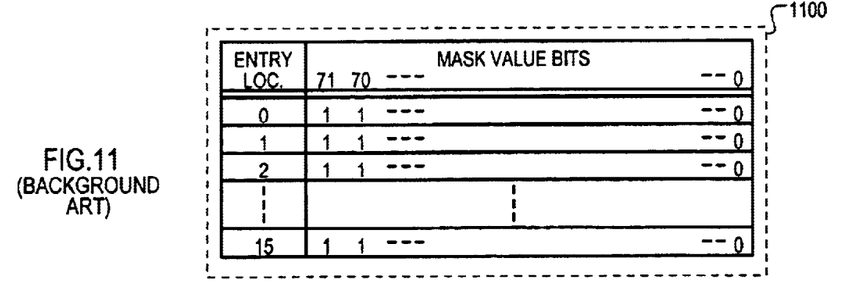
FIG. 11 is a block diagram of a conventional mask register set.

Referring now to FIG. 11, a conventional mask register set 1100 is set forth. A mask register set 1100 may include a set of registers that can store various mask values. Registers within a register set may be accessed by a register address. In the very particular example of FIG. 11, a mask register set 1100 may contain a set of registers accessible by address values 0–15.

Conventionally, the number of available registers in a CAM block may be limited. In the example of FIG. 11, a single set of 16 registers may be included. Such a set of 16 registers may have a predetermined width (e.g., 72-bits).

If a mask value having a width greater than a mask register location is needed, multiple register locations may be utilized. For example, referring to FIG. 11, a 144-bit search may utilize register location pairs. A 288-bit search may utilize four 72-bit register locations. Similarly, a 576-bit search may utilize eight register locations.

While conventional mask register sets may store mask values for re-use, such conventional approaches can have drawbacks. As noted above, when a stored mask value has a width greater than one register, multiple register locations may be used to store a mask (e.g., 2 72-bit locations may store a 144-bit mask value). However, a command issuing device, such as an NPU may have to maintain a record of which mask register index values are associated with one another. It would be desirable to remove this burden of tracking the state of the registers in register sets by an NPU, or the like.

SUMMARY OF THE INVENTION

According to the present invention, a method for storing content addressable memory (CAM) mask values may include storing one or more mask values according to a mask size. Mask values may be stored in a mask register set having a number of locations. Mask register set locations may be arranged into regions, with each region storing a mask value of a predetermined size.

According to one aspect of the embodiments, storing CAM mask values may include storing a mask value in a portion of a location within a mask register set according to a portion identification (ID) value.

According to another aspect of the embodiments, storing CAM mask values may include storing a mask value in multiple mask register set locations for mask values having sizes greater than a single mask register set location.

According to another aspect of the embodiments, storing CAM mask values may include storing mask values of size N in one region and storing mask values of size $N*2^I$ in another region, where I can be a number that is greater than zero.

According to another aspect of the embodiments, storing CAM mask values may include storing a mask value of a first size in a first region and storing a mask value of second size in a second region that overlaps the first region.

According to another aspect of the embodiments, storing CAM mask values may include receiving a mask write request. A mask write request can include a mask value having a mask size.

According to the present invention, a method for retrieving CAM mask values may include retrieving one or more mask values from mask register set regions. Mask register set regions can store mask values of different predetermined sizes.

According to one aspect of the embodiments, retrieving a mask value can include accessing only one location from a first region. Such an access can retrieve a mask value of a first size. In addition, only one location from a second region may be accessed to retrieve a mask value of a second size that is different than the first size.

According to another aspect of the embodiments, retrieving a mask value can include accessing more than one location from a third region to retrieve a mask value of a third size.

According to another aspect of the embodiments, a method of retrieving mask values may further include receiving a read mask request. A read mask request may include a mask register set location corresponding to a mask value.

According to another aspect of the embodiments, a method for retrieving mask values may further include receiving a search request. A search request can include a mask size value and mask register value. A mask register value can identify a mask value in a mask register set region.

According to another aspect of the embodiments, a method may further include applying a portion of the at least one mask value to a comparand value according to a portion identification (ID) value.

According to the present invention, a CAM device may include a mask register set. A mask register set may include two or more regions for storing different size mask values.

According to one aspect of the embodiments, one of the regions in a mask register set may include locations for storing more than two mask values in a single location.

According to another aspect of the embodiments, mask register set regions can include a first region for storing mask values of a first size and a second region for storing mask values of a second size that is different than the first size. A third region can overlap the first or second region. A third region can store mask values of a third size that is different than the first and second sizes.

According to another aspect of the embodiments, mask register set regions can include a first region for storing mask values of size N, and a second region for storing mask values of size $N*2^I$. A value I can be greater than zero.

According to another aspect of the embodiments, mask register set regions can include four or more regions, each of which store mask values of different sizes.

According to another aspect of the embodiments, a CAM device may further include a request store. A request store may include various regions for storing values of a request. Such values can include, without limitation, a size value that indicates a size of a mask value, a command value that indicates a particular CAM operation, a mask register value that identifies a particular mask value in a region, a device identification value that identifies a CAM device, and an index value that can store a mask register set address.

According to one aspect of the embodiments, a CAM device may further include a CAM array that can be connected to a mask register set. A CAM array can include a number of entries. CAM array entries can store data values for comparison with a comparand value.

DETAILED DESCRIPTION OF THE EMBODIMENTS

Various embodiments of the present invention will now be discussed in conjunction with a number of figures.

Figure 1:
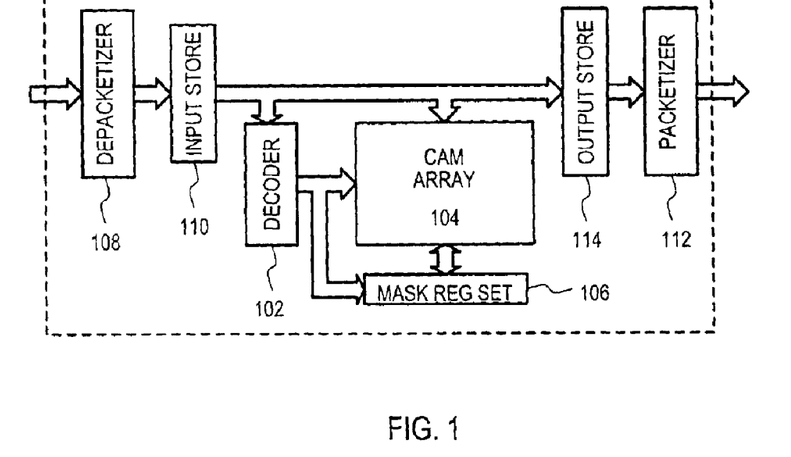
FIG. 1 is a block diagram of a CAM device according to a first embodiment of the present invention.

Referring now to FIG. 1, a CAM device according to a first embodiment of the present invention is set forth and designated by the general reference character 100. A CAM device 100 may include a command decoder 102, a CAM array 104, and a mask register set 106.

FIG. 1 shows an example of a CAM device 100 that may receive requests in packet form and provide response to such requests in packet form. Accordingly, a CAM device 100 can include a de-packetizer 108, an input store 110, as well as a packetizer 112 and an output store 114.

In a "cascaded" CAM system, a CAM device (such as 100) may be arranged in series with one or more other CAM devices. In a bus based CAM system, CAM devices may be connected to a requesting device and to one another by a common bus.

A request issued by a requesting device for a CAM device 100 may include various information values for executing an operation in a CAM array 104. As but one example, in a search request, a mask value and a key value can be provided.

As noted above, in one particular embodiment, a request (and a response from such a request) may be in a packet format. Information values contained in such packets may occupy particular data fields. Various examples of request types and formats will be described in more detail at a later point herein.

A de-packetizer 108 may receive a request (such as a search command) in a data packet. As is well understood, a packet may include a number of bits arranged into a predetermined format. A de-packetizer 108 may organize information contained in a received packet. Such information may then be stored in an input store 110. More particularly, a de-packetizer 108 may receive a packetized request, and de-packetize such a request into a number of different data fields.

A request may have various fields according to a particular request type (e.g., search, read, write etc.). A search request can include a mask register field and a key field. A mask register field may store a mask register address that points to a register location storing a particular mask value. A key field may store all or a portion of a comparand value. In addition or alternatively, a search request may include a key index field in place of a key field. A key index field may store a comparand register address that points to a register location storing a comparand value, or portion of a comparand value.

In a particular arrangement, a de-packetizer 108 may include receiver circuits that receive data transmitted over a medium (e.g., one or more conductive lines) in a packet format.

It is understood that packet data does not necessarily imply any particular transmission protocol, and may preferably be transmitted according to a unique protocol. Typically, the packet data may include a separation mechanism (e.g., idle codes, predetermined signals, etc.) that may distinguish one packet from the next. In addition, a packet may include format information for defining an arrangement of data within a packet (e.g., number of bytes, etc.).

It is further understood that while the embodiment of FIG. 1 shows an example of a CAM device that may receive commands in packet form, the present invention is not limited thereto. A CAM device according to the present invention may not include a de-packetizer. Instead, requests may be transmitted as signals on one or more lines, or other means, to a command decoder 102. Key (or key index) values and/or mask (or mask index) values may be received in a similar fashion.

An input store 110 may store data values from a request. As but one example, an input store 110 may preferably include a first-in-first-out memory (FIFO), but may include alternate storage circuits such as a cache based on a random access memory (RAM), or the like.

A command decoder 102 may receive a command directly, or as data fields from an input store, and activate predetermined signals for controlling the operation of a CAM array 104 and/or for accessing various registers, such as a comparand register set (not shown) and/or a mask register set 106.

A CAM array 104 may contain a number of entries, each of which may contain a data value for comparison with a key value (i.e., a comparand). While CAM entries may take various forms, such entries may preferably include a number of CAM cells, or the like, arranged into one or more arrays. A CAM array 104 may store data values in rows, or the like, for comparison with a key value of a received request. In this way, a CAM array 104 may support a search function.

In response to search control signals from a command decoder 104, a CAM array 104 may output a search result, and/or a status of a search result.

A mask register set 106 may include a number of mask registers. Unlike conventional approaches, mask registers may be organized to accommodate mask values of different sizes. For example, registers may be pre-designated to store only mask values of one or more predetermined sizes. As but one particular example, registers of size "N" bits, may be configured to store mask values of size N*I, where I may be greater than zero. Such an arrangement can reduce the burden of a search request issuing device (such as a network processor unit, NPU), as a single mask register index value may access a mask value that includes multiple register locations. In one particular arrangement, mask values may be stored in a mask register by a mask write command that can specify a predetermined key size and a mask register set location.

An organization of mask register set locations according to the present invention may take a variety of forms. For example, certain mask register set locations may be grouped together for storing mask values of only a certain size—without regard to location position with respect to one another. Preferably, mask register set locations may be physically organized into regions that store mask values of only a certain size. More preferably, mask register set locations may be organized into contiguous addressable locations, with one or more regions overlapping another.

An output store 114 may include various fields for storing output data for a CAM device 100. Such output data may include, without limitation, responses to requests, such as searches, writes and/read requests.

A packetizer 112 may packetize data from an output store 114. In a very particular arrangement, a packetizer 112 may include an encoder that encodes outgoing data (e.g., an encoder that may encode 8-bit bytes into 10-bit values) and transmitter circuits that transmit such values over a medium (e.g., one or more conductive lines). A packetizer 112 may thus output a packet of values that form a response from a request, such as a search request or a mask configuration request, as but two examples.

Of course, while the embodiment of FIG. 1 shows an example of a CAM device that may output responses in packet form, the present invention is not limited to such an arrangement. A CAM device according to an embodiment may not include a packetizer. Instead, responses may be transmitted over one or more lines, or by other means, to a requesting device.

Figure 2:
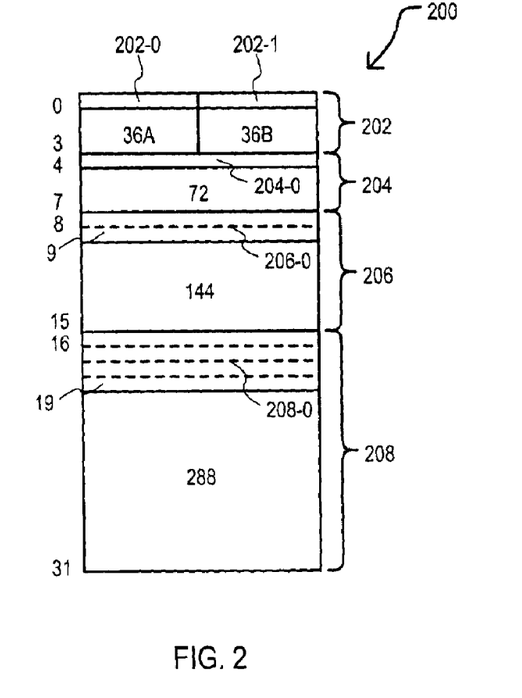
FIG. 2 is a mask register set according to a second embodiment of the present invention.

Referring now to FIG. 2, a mask register set according to a second embodiment is set forth and designated by the general reference number 200. A mask register set 200 according to a second embodiment may include a number of regions for storing mask values of different sizes. In the particular example of FIG. 2, a mask register set 200 can include four regions 202, 204, 206 and 208 for storing four mask values of four different sizes. Each region (202, 204, 206 or 208) of the mask registers may include one or more register locations. In the particular example of FIG. 2, a mask register set 200 may have 32 locations, labeled 0–31. Further, each location on a mask register set 200 may have a predetermined size (e.g., 72-bits).

As noted above, each region (202, 204, 206 or 208) may store mask values of a different size. A first region of mask register 202 can illustrate a case where one register location may store more than one mask value. In particular, in FIG. 2, a region 202 may store two mask values of a first size (36-bits). A first location of region 202 may include location 0. Thus, a location 0 of region 202 may store two 36-bit masks in two portions 202-0 and 202-1. Remaining locations of a region 202 may have the same general arrangement as location 0. Thus, a region 202 may include locations (locations 0–3) that are logically divided into two 36-bit portions. Such portions may be identified as representing a particular "side" (A or B). In one approach, a particular side (A or B) may be identified by distinct versions of a search command. For example, a search command identified as "36A" may utilize an "A" side portion of a location, while a search command identified as "36B" may utilize a "B" side portion of a location.

It should be noted that while the example of FIG. 2 shows mask register set locations that can be divided into two portions, alternate embodiments could provide a larger number of portions in an entry. As but one example, a single 72-bit location may be logically divided into three 24-bit portions.

A region 204 can illustrate a case where mask value sizes can be the same as a mask register location width. In FIG. 2, a second region 204 of a mask register set may store 72-bit masks at locations 4–7. One particular location of a region 204 is shown as 204-0 at location 4.

A region 206 of mask register set 200 can illustrate a case where a mask size can be greater than a register width. In the example of FIG. 2, a region 206 may store mask values of 144-bits. In particular, a region 206 may include eight locations 8–15. However, such locations may be pre-designated to store mask values that span two locations. Thus, a region 206 may be conceptualized as including four entries, each of which may include two locations. In the particular example of FIG. 2, an entry 206-0 can include locations 8 and 9, and may store a 144-bit mask.

A region 208 of mask register set 200 can illustrate another case in which a mask size can be greater than a register width. In the example of FIG. 2, a region 208 may store mask values of 288-bits. In particular, a region 208 may include sixteen mask register locations 16–31. Each location may have a 72-bit width. Like region 206, locations 16–31 may be pre-designated to store masks that span multiple locations. More particular, a region 208 may store masks values that span four locations. Thus, a region 208 may be conceptualized as including four entries, each of which may include four locations. One particular entry in region 208 is shown as 208-0, and may include locations 16–19 that store a 288-bit mask value.

It should be noted that while a mask register set 200 of FIG. 2 shows four particular regions, a mask register set according to the present invention may have fewer or greater numbers of regions for different mask sizes.

It is also noted that unlike conventional approaches, according to the present invention, when a location in a mask register set 200 is accessed, the size of a mask value may already be known. Thus, a requesting device, such as a network processing unit, may not have to track multiple register locations for large (e.g., larger than a location width) mask values. As but one example, a 288-bit mask value may be stored at locations 16–19 of mask register set 200. Conventionally, a search request may have to include all register locations (16–19) to indicate an entire 288-bit mask value. However, according to the present invention, a search request may include one register location (e.g., 16) to indicate four locations storing a 288-bit mask value.

Figure 3A:
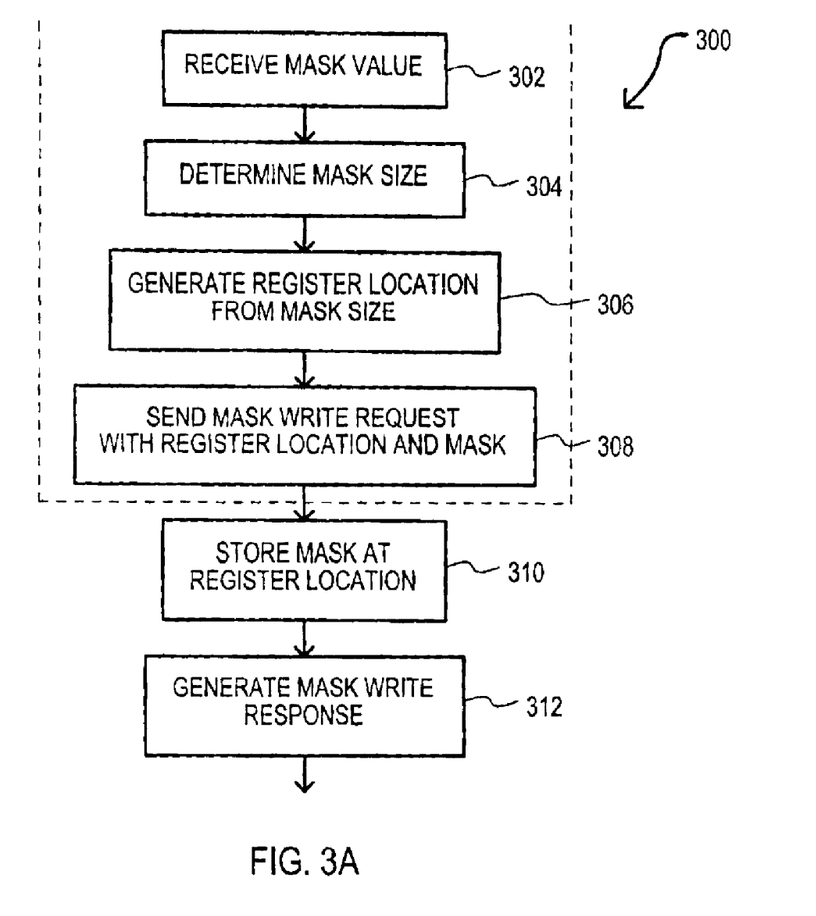
FIG. 3A is a flow diagram of a method for storing a mask value in a CAM according to a third embodiment.

Referring now to FIG. 3A, a method for storing content addressable mask values according to a third embodiment is set forth and designated by the general reference number 300. A method 300 may include the steps of receiving a mask value (step 302), determining a mask size (step 304), generating a register location from a mask size (step 306), and sending a write request with a register location and mask value (step 308).

A step 302 may include a requesting device, such as a host device, receiving a mask value. A mask value may be received from a source external to a host, and/or may be generated according to one or more search "rules".

A step 304 may include examining a received mask value to determine a number of bits of the mask value. Alternatively, a step 304 may include reading a field within a configuration command that may include a mask size code. Of course, while a mask size indication may be transmitted with a mask value, a mask size indication may also be transmitted after or before a mask value.

A step 306 may include accessing a table or the like, that indicates which particular mask register set locations are pre-designated for a given mask size. Further, a status for such location(s) may also be included in such a table. A status may indicate if a given location already stores a mask value.

As but one very particular example, if a mask register set has the structure such as that shown in FIG. 2, if a mask size value is 36 bits, locations 0–3 could be provided as possible storage locations. If a mask size value is 72 bits, locations 4–7 could be provided as possible storage locations. If a mask size value is 144 bits, locations 8–15 could be provided as possible storage locations. Finally, if a mask size value is 288 bits, locations 16–31 could be provided as possible storage locations.

Figure 3B:
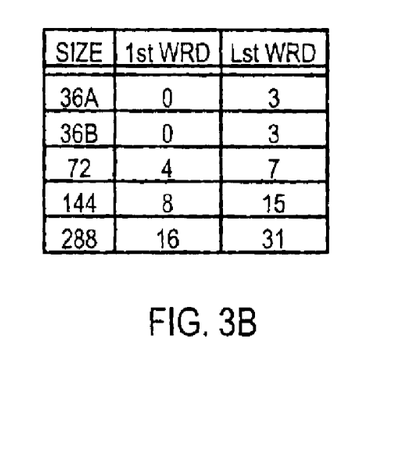
FIG. 3B is a table showing register pointers for storing mask values according to an embodiment.

FIG. 3B shows one example of a table that may be used in a step 306. Such a table can cross reference particular mask value sizes SIZE with a first word 1$^{st}$ WRD and a last word Lst WRD. A first word 1$^{st}$ WRD may point to a first available location for a given mask value size. Similarly, a last word Lst WRD may point to a last available location for a given mask value size. As a mask value of a particular size is stored, a head pointer HD PTR may be incremented.

A step 308 may include sending a mask write request with a register location and mask value to a CAM device. In one very particular arrangement, a step 308 may include sending a request in packet format having fields that include a register location and a mask value.

In one very particular arrangement, steps 302 to 308 of a method 300 may occur in a requesting device.

A method 300 may further include storing a mask at a register location (step 310) and generating a write mask response (step 312).

A step 310 may include accessing a mask register set location according to an address, and writing a mask value to such a location. For mask values that are smaller than a register location width, a step 310 may include masking selected portions of a register location. Further, for mask values that are larger than a register location width, a step 310 may include incrementing an address and writing data values to such an incremented address.

A step 312 may include determining if a mask write operation is successful or not, and generating one type of output value if a write operation is successful, or another type of output value if a write operation fails (e.g., an error code). In one very particular approach, a step 312 may also include "packetizing" such information.

In one very particular arrangement, steps 310 and 312 of a method 300 may occur in a CAM device.

In this way, mask values may be written to one or more predetermined mask register set locations according to a mask value.

Having described a method of storing mask values according to one embodiment, a method for applying stored mask values in a CAM device will now be described with reference to FIGS. 4A and 4B.

Figure 4A:
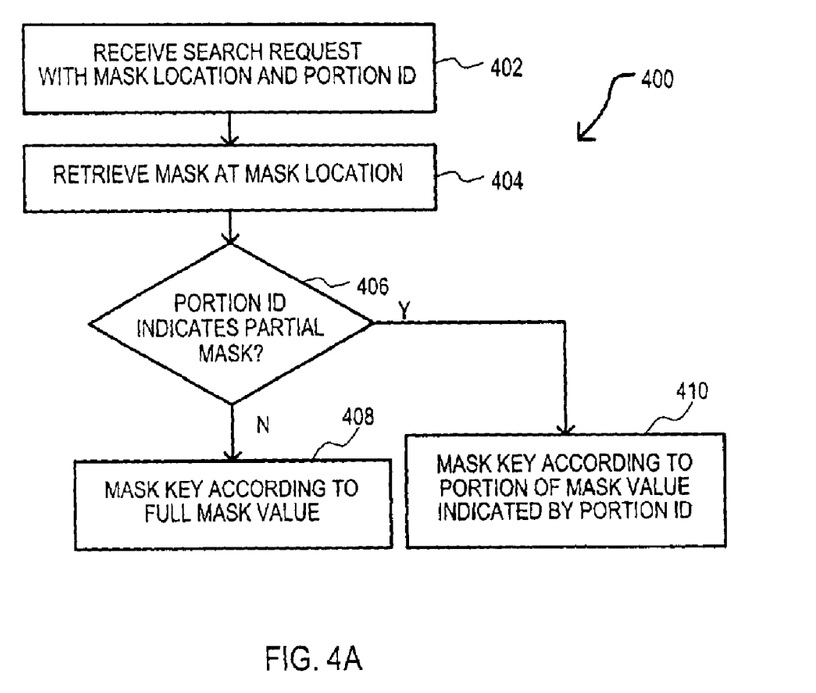
FIG. 4A is a flow diagram of a method for retrieving mask values according to an embodiment.

Referring now to FIG. 4A, a method for applying stored mask values of a CAM device is set forth in a flow diagram and designated by the general reference number 400. A method 400 may include the steps of receiving a search request that includes a mask register location and a portion identification (ID) value (step 402) and retrieving a mask value at the mask register location (step 404). A method 400 may further examine a portion ID value to see if partial masking is indicated (step 406). If a portion ID value does not indicate partial masking, a key may be masked according to a full mask value (step 408). If, however, a portion ID value docs indicate partial masking, a key may be masked according to a portion of a mask value indicates by a portion ID (step 410).

A method 400 will now be described with reference to a particular example. If reference is made back to FIG. 2, it will be assumed that a 36-bit mask value from a side "B" is applied according to a method 400.

In a step 402, a CAM device may receive a search request that uses a mask value location corresponding to a 36B mask value (e.g., any of locations 0–3). A "B" value can indicate a "B" portion of an entry. As but one example, a search request may be in packet form and include a field for storing a mask register set location, and a field identifying a particular type of mask (e.g., 36B).

In a step 404, a mask register set 200 may be accessed at an indicated location. In one very particular case, a step 404 may include applying a mask value register address, and reading a mask value from such an address. In the case of FIG. 2, such a mask value may be a 72-bit value, half of which is a desired 36-bit mask.

In a step 406, an examination of a portion ID of "36B" can indicate that only one half of a mask value is desired. Accordingly, in a step 410, a "right" side 36-bit portion of a retrieved 72-bit mask value can be applied to a key. However, a portion ID could have various other values in the example of FIG. 2, including a 36A, 72, 144, or 288 value.

In the case of a 36A value, in a step 410, a "left" side 36-bit portion of a retrieved 72-bit mask value can be applied to a key.

In contrast, a 72, 144 or 288 portion ID value may indicate no partial masking. Thus, all of a retrieved 72-bit mask value may be applied to a given key. Of course, multiple such mask values may be applied in the case of 144 and 288 bit mask values.

Still further, it is understood that while the method 400 describes a mask value as being applied to a "key" such a step represents but one possible matching function approach. As but one alternative, steps 408 and 410 may include applying mask values (or portions thereof) to data values that are compared with a key.

In this way, mask values may be retrieved and applied according to a portion ID value, which can indicate that only a portion of a retrieved mask value is to be applied to a key.

Figure 4B:
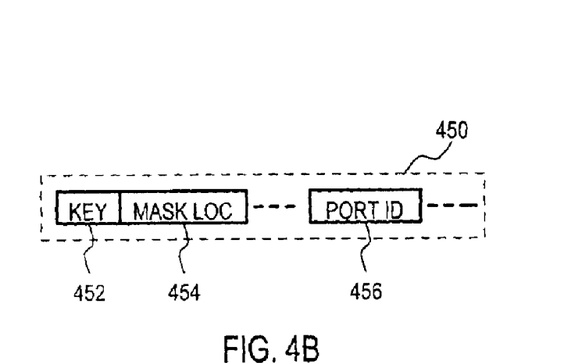
FIG. 4B shows one example of a search command that may be used in the method of FIG. 4A.

FIG. 4B shows an example of a search command according to an embodiment. A search command 450 may include a key field KEY 452, a mask location field MASK LOC 454 and a portion identification field PORT ID 456. A key field KEY 452 may indicate a key value that can be masked or not masked, and that may be compared to CAM entries to determine if a match exists. A key field KEY may be an actual comparand value, or may include an index that points to a stored comparand value, such as one stored in a comparand register set.

A mask location field MASK LOC 454 may include a value that indicates a location of a mask value in a mask register set. Such a value may be a register address, as but one example.

A portion identification code field 456 may store a value (e.g., A side or B side) that can indicate what portion (if any) of a mask value is to be applied in a compare operation.

In this way, a search request may include data that can identify a portion of a value stored at mask register set location.

According to the present invention, while a mask register set may include two or more ranges for storing mask values of predetermined sizes, a mask register set may also include overlapping ranges. Thus, one location may be capable of storing one part of a mask value of one size, or one part of a mask value of a different size. One example of a mask register set having overlapping ranges is shown in FIG. 5 and designated by the general reference character 500.

A mask register set 500 may have various regions. The particular example of FIG. 5 includes 128 locations at addresses 080 (hex) to 0FF (hex). Addresses 080 to 08F can each store two 36 bit mask values in the same general fashion as region 202 in FIG. 2. Similarly, addresses 090 to 09F can each store a 72 bit mask value, like region 204 of FIG. 2, addresses 0A0 to 0BF can each store one half of a 144 bit mask, like region 206 of FIG. 2, and addresses 0C0 to 0FF can each store one fourth of a 288 bit mask, like region 208 of FIG. 2.

Figure 5:
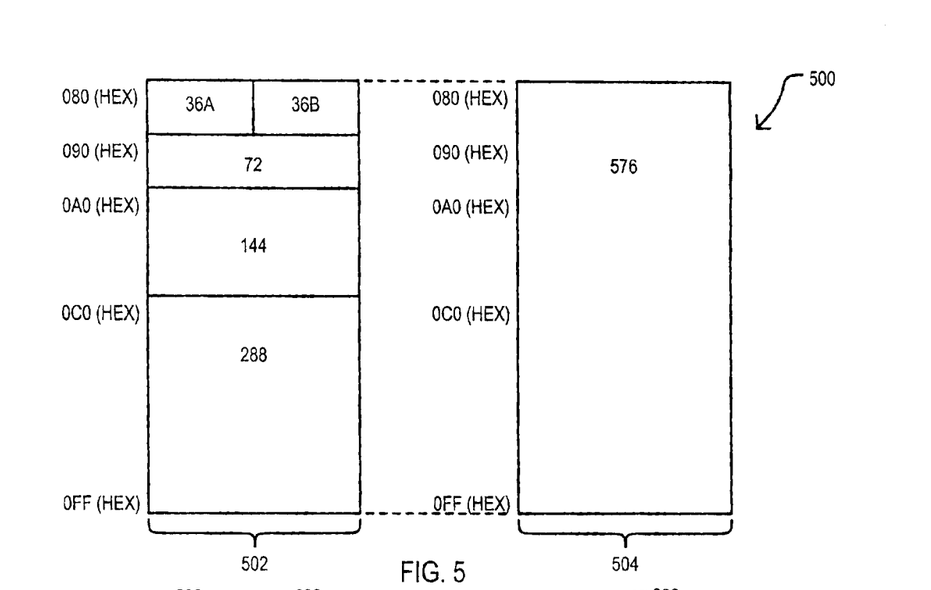
FIG. 5 is a block diagram of a mask register set according to a fifth embodiment of the present invention.

Thus, as indicated by 502 in FIG. 5, a mask register set 500 may include multiple regions for storing different size mask values (e.g., 36 bit, 72 bit, 144 bit and 288 bit). However, as noted above, a mask register set may also include one or more overlapping regions.

FIG. 5 shows one example of a 576 bit region 504 that may overlap the above mentioned regions. In particular, at the same time addresses 080 to 0FF may include four regions, a same address 080 to 0FF may include one region for 576 bit values. Thus, an address location may be predetermined to store all or a portion of more than one size of mask value. For example, in FIG. 5, an address 080 may store two 36 bit mask values, or one eighth of a 576 bit mask value. Similarly, an address 0C0 may store one fourth of a 288 bit mask value or one eighth of a 576 bit mask value.

FIG. 5 shows a mask register set arrangement in which each region may store a same number of mask values. In particular, each region stores sixteen mask values. That is, addresses 080 to 08F may store sixteen 36 bit "side A" mask values and sixteen 36 bit "side B" mask values. Addresses 090 to 09F may store sixteen 72 bit mask values. Addresses 0A0 to 0BF may store sixteen 144 bit values. Addresses 0C1 to 0FF may store sixteen 288 bit mask values. Finally, in an overlapping arrangement, addresses 080 to 0FF may store sixteen 576 bit mask values.

Figure 6A:
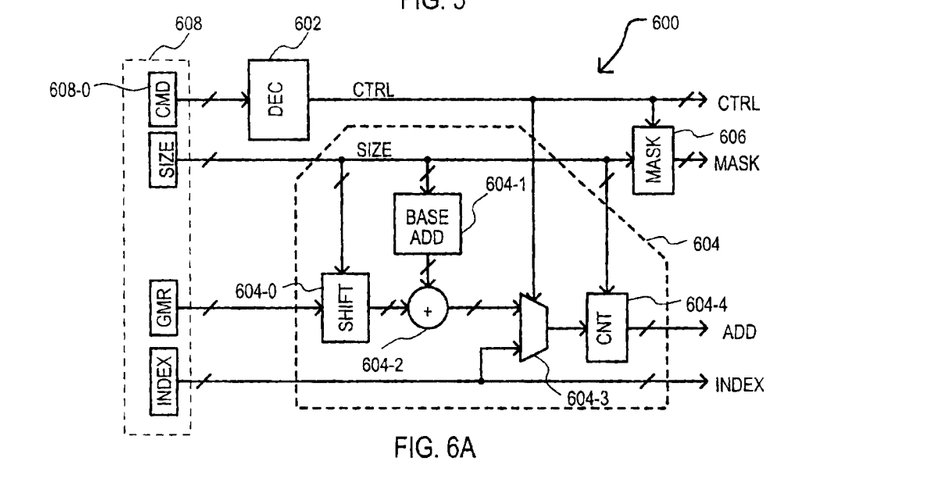
FIG. 6A is a block diagram of mask register set access circuit according to an embodiment.

Referring now to FIG. 6A, one very particular example of a mask register set access circuit is shown in a block schematic diagram, and designated by the general reference character 600. A circuit 600 may include a command decoder 602, an address generator 604, and a mask circuit 606. In the particular example of FIG. 6A, a circuit 600 may also include a request store 608.

A command decoder 602 may generate control signals CTRL according to a command of a received request. Such a command may be stored at a command location 608-0 of a request store 608.

An address generator 604 can provide an address, or series of addresses, for a mask register set. The particular operation of an address generator 604 may vary according to a particular request that is executed. While an address generator 604 may take various forms, the particular address generator of FIG. 604 can include a shift circuit 604-0, a base address circuit 604-1, an adder 604-2, a multiplexer (MUX) 604-3, and a counter 604-4. Particular modes of operation for such circuit portions will be described in more detail with reference to FIGS. 6B to 6E.

A mask circuit 606 may generate a mask command MASK according to a size value. In one particular approach, a mask command MASK can indicate if one side (e.g., side A) of a mask register set location is masked or another side (e.g., side B) of such a location is masked.

A request store 608 may store various values associated with a request. In the particular example of FIG. 6A, a request store 608 may include a command field CMD, a size field SIZE, a mask register field GMR, and an index field INDEX. Particular values stored in the various fields may differ according to a particular operation. This will be described in more detail below.

Figure 6B:
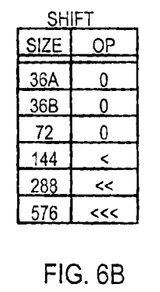
FIGS. 6B to 6E are tables showing the operation of various portions of the circuit of FIG. 6A.

FIG. 6B shows one example of the operation of a shift circuit, such as that shown as item 604-0 in FIG. 6A. As shown, how a shift circuit functions may vary according to a size value. In particular, a shift circuit may shift an input value to generate an offset address from size value. FIG. 6B can correspond to a mask register set such as that shown in FIG. 5. Thus, for mask value sizes of 36A, 36B and 72, one mask value can be located at a single address, thus no shifting may be necessary. However, for a mask value of size 144 bits, a shift operation may shift a value by one binary digit (multiply by 2), to thereby account for the fact that two addresses store each mask value. Similarly, for mask values of size 288 bits, a shift operation may shift a value by two binary digits (multiply by four), and a for 588 bit sizes, shift by three binary digits (multiply by eight).

Figure 6C:
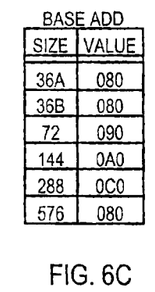

FIG. 6C shows one example of the operation of a base address circuit such as that shown as 604-1 in FIG. 6A. A base address circuit 604-1 may generate a mask register set base address according to a size value. FIG. 6C can correspond to a mask register set such as that shown in FIG. 5. Thus, a base address circuit 604-1 may provide the first location of each region in a mask register set according to a size value.

Figure 6D:
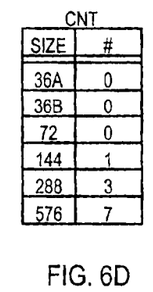

FIG. 6D shows an example of the operation of a counter circuit such as that shown as 604-4 in FIG. 6A. A counter circuit 6044 can add to (e.g., increment) a received address a number of times to generate a sequence of addresses based on a size value. FIG. 6D can correspond to a mask register set such as that shown in FIG. 5. Thus, a counter circuit 604-4 may not generate any additional addresses for mask size values of 36A, 36B and 72, as such mask value occupy single addresses. However, for a mask size of 144, a counter circuit 604-4 may generate a second address by incrementing a received address once. Similarly, for a mask size of 288, a counter circuit 604-4 may generate second, third and fourth addresses, by incrementing a received address three times. For a mask size of 576, a counter circuit 604-4 may generate second through eighth addresses by incrementing a received address seven times.

In this way, a sequence of addresses may be generated for accesses to mask values that span multiple addresses.

Figure 6E:
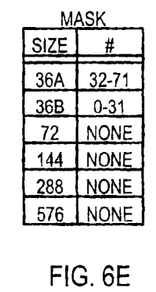

FIG. 6E shows an example of the operation of a mask circuit such as that shown as 606 in FIG. 6A. A mask circuit 606 can generate a mask value according to a received size value. FIG. 6E can correspond to a mask register set such as that shown in FIG. 5. Thus, a mask circuit 606 may generate one mask value for 36A size mask values, and another for 36B size values. More particularly, for 36A size mask values, a mask circuit 606 can indicate that a second portion of a register location may be masked (bits 36–71 of 0–71). For 36B size mask values, a mask circuit 606 can indicate that a first portion of a register location may be masked (bits 0–35 of 0–71). For the remaining sizes of FIG. 6E, no masking may occur.

A mask circuit 606 may indicate a particular masking operation in a variety of ways. As but two of the many possible approaches, a mask circuit 606 may provide actual bit mask values, or alternatively, may activate a collection of signal that indicates a particular masking pattern.

Of course, FIG. 6E shows but one example of possible masking of a mask circuit. Different masking arrangements could be generated in alternate embodiments, including the masking of fields and/or other forms of masking non-contiguous portions of a mask value.

The operation of a mask register set access circuit 600 will now be described with reference to a number of particular operations, including a mask write operation, a mask read operation, and a search operation.

Figure 7A:
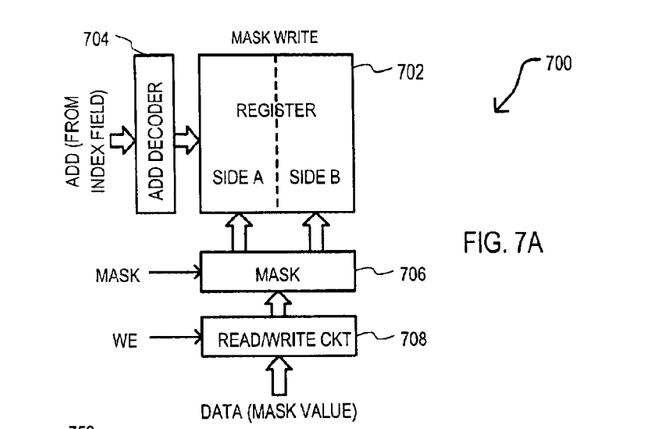
FIGS. 7A to 7D are various block and schematic diagrams illustrating a mask write operation according to one embodiment.
Figure 7B:
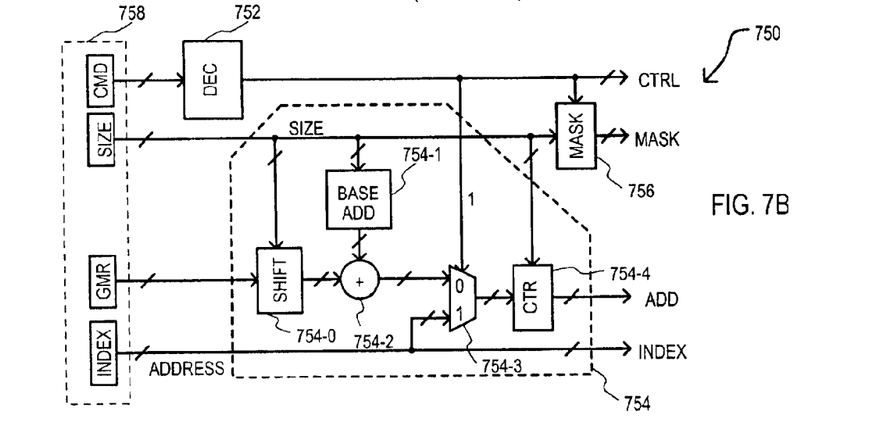
Figure 7C:
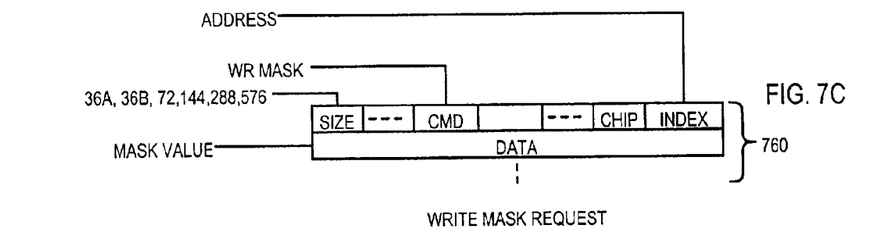
Figure 7D:
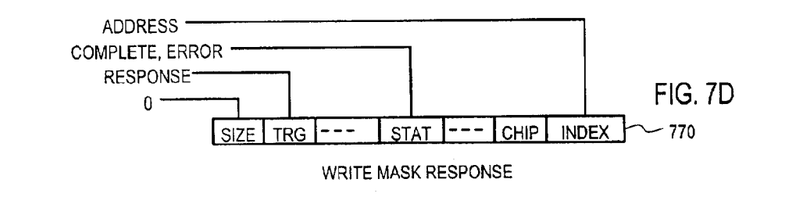

A mask write operation will now be described with reference to FIGS. 7A to 7D. FIG. 7A is a block diagram of a mask register set circuit. FIG. 7B shows the same mask register access circuit as FIG. 6A. FIG. 7C shows an example of a mask write request. FIG. 7D shows an example of a mask write response.

Referring to FIG. 7A, a mask register set circuit 700 may include a mask register set 702, an address decoder 704, a mask circuit 706, and a read/write circuit 708. A mask register set 702 may include a number of addressable locations, each of which can store one mask value (e.g., a 72-bit mask value), more than one mask value (e.g., 36 bit mask values for an A and B side), or a portion of a mask value (e.g., a portion of a 144 bit, 288 bit or 576 bit mask value).

An address decoder 704 may decode a received address to enable access to a particular mask register set location. An address decoder 704 may include conventional decoding circuits. Further, an address decoder 704 may preferably decode addresses for other register sets, such as a comparand register set, as but one example.

A mask circuit 706 may mask write operations to a mask register set location according to a mask value MASK. A mask circuit 706 may include conventional mask write circuits that prevent data from being written to selected bits of a register location. In one very particular approach, a mask circuit 706 may mask bits 0–35 (a "side A"), mask bits 36–71 (a "side B"), or not mask at all.

A read/write circuit 708 may provide an access path to mask register set locations, to enable read and write operation for such locations. A read/write circuit 708 may include gate circuits for enabling a data path. In addition, or alternatively, a read/write circuit 708 may include amplifier circuits, or the like, for driving data values during write operation and/or read operations.

Referring now to FIG. 7B, a mask register set access circuit is designated by the general reference character 750 and may include the same circuit portions as FIG. 6A. Like portions will be referred to by the same reference character but with the first two digits being a "75" instead of a "60."

Referring now to FIG. 7C, a mask write request 760 may include various fields previously described, including a size field SIZE, a command field CMD, and an index field INDEX. In addition, FIG. 7C shows a device identification (ID) field CHIP.

A mask write request can further include a mask value in one or more data fields DATA. Thus, it is understood that in the case of mask value sizes that can fit in a single mask register set location (e.g., 36 bit or 72 bit mask values in registers of 72 bit width), a mask write request may include a single data field. However, for mask values of larger size, more data fields may follow, one after another. Thus, assuming a 72 bit mask register width, a mask write for a 144 bit mask value may include two data fields, a mask write for a 288 bit mask value may include four data fields, etc.

In alternate approaches, a separate mask write command may be issued for each portion of a mask value (e.g., four write mask commands for a 288 bit mask value written to 72 bit wide locations).

Referring now to FIG. 7D, a mask write response 770 may have various fields, including a size field SIZE, a target field TRG, a status field STAT, a chip field CHIP, and an index field INDEX. SIZE, CHIP and INDEX fields may generally follow those of a corresponding mask write request 760. A target field TRG may identify a response as a response. A status field STAT may indicate if a corresponding mask write request 760 was successful or not.

Referring now to FIGS. 7A to 7D a mask write operation will now be described. A mask request 760 may be received from a requesting device, or the like. A size field SIZE may indicate one of many possible mask size values. In the particular example shown, mask size values may be 36A, 36B, 72, 144, 288 or 576. A command field CMD may indicate a mask write operation. A device ID field CHIP may, or may not differentiate between multiple devices receiving the write mask request. In particular, in systems containing multiple CAM devices, a device ID field value may indicate that a mask write operation is directed to a single CAM device, a group of CAM devices and/or all CAM devices. An index field INDEX may store a mask register set address. Data field(s) DATA may store a mask value that is to be written.

Upon receiving a mask write request 760, a CAM device may store values from a command field CMD, a size field SIZE, and an index field INDEX in corresponding location of a request store 758 in circuit 750. A command decoder 752 may decode a write mask command to generate control signals CTRL. Control signals CTRL may enable a path from index field INDEX through MUX 754-3 to apply a received write address to a counter 754-4.

In this way a first write address may be generated.

A write address may then be applied to an address decoder 704 to access a particular register location. At the same time, data from a data field DATA in a write request can be applied to read/write circuit 708.

A circuit 750 may provide additional functions according to a size value. For a size value of 36A or 36B, as noted above, a mask circuit 756 may generate an appropriate signal MASK. Such a mask signal MASK may be applied to a mask circuit 706, providing appropriate side (e.g., side A or side B) masking in a write operation.

For size values of 144, 288 or 576, a counter circuit 754-4 may generate subsequent addresses by incrementing a received address. Such addresses may be applied to an address decoder 704 to select further mask register set 702 locations.

Further, for each subsequent address, next mask data from next data fields DATA of a write request 760 may be applied to a read/write circuit 708.

In this way, a mask write request may be executed in a CAM device having a mask register set with multiple regions for storing different size mask values.

Figure 8A:
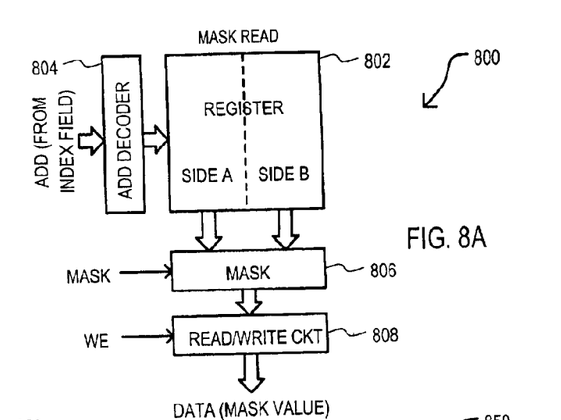
FIGS. 8A to 8D are various block and schematic diagrams illustrating a mask read operation according to one embodiment.
Figure 8B:
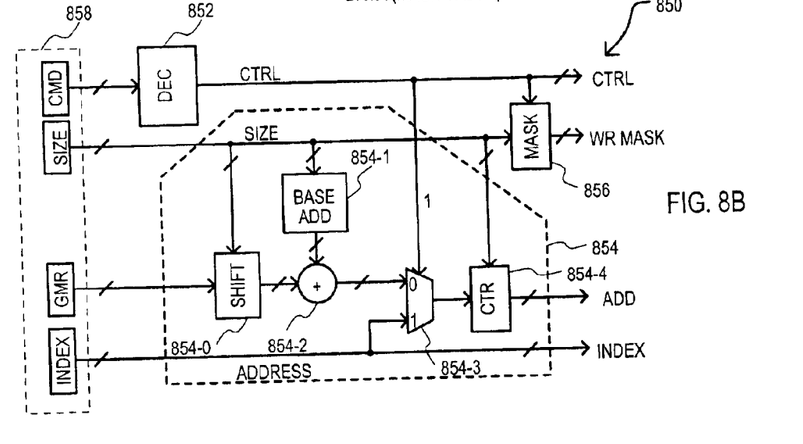

A mask read operation will now be described with reference to FIGS. 8A to 8D. FIGS. 8A and 8B may include the same general items as FIGS. 7A and 7B. To that extent, like items will be referred to by the same reference character but with the first digit being an "8" instead of a "7."

Figure 8C:
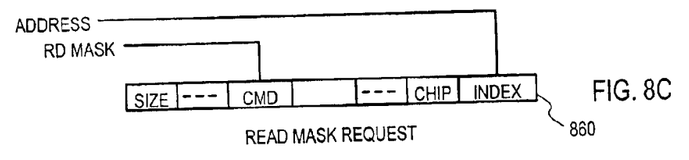

FIG. 8C shows a mask read request 860 according to an embodiment. A mask read request may include various fields previously described, a command field CMD, a device ID field CHIP, and an index field INDEX.

Figure 8D:
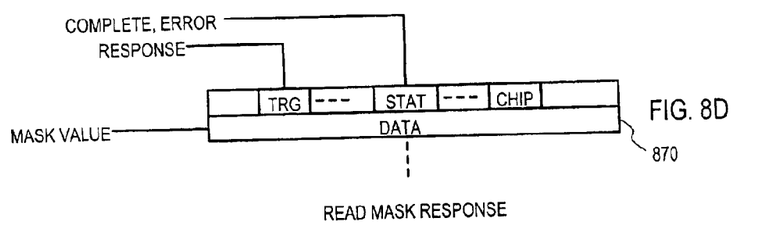

Referring now to FIG. 8D, a mask read response 870 may have various fields, including a target field TRG, a status field STAT, and a chip field CHIP. As in the case of a write mask response 770, a target field TRG may identify a response as a response, and a status field STAT may indicate if a corresponding mask read request 860 was successful.

A mask read response can further include a mask value in a data field DATA.

Referring now to FIGS. 8A to 8D, a mask read operation will now be described. A mask read request 860 may be received from a requesting device, or the like. A command field CMD may indicate a mask read operation. An index field INDEX may store a mask register set address.

Upon receiving a mask read request 860, a CAM device may store values from a command field CMD and an index field INDEX in corresponding location of a request store 858 in circuit 850. A command decoder 852 may decode a read mask command to generate control signals CTRL. Control signals CTRL may enable a path from index field INDEX through MUX 854-3 to apply a received read address to a counter 854-4.

In this way a read address may be generated.

In particular embodiments, a size value SIZE may be sent with a request and/or derived from a mask register set address. Such a value may be applied to a counter circuit to generate a sequence of addresses for mask values that occupy multiple locations. Of course, such an operation assumes that an address supplied by a mask read request is a first address for a mask value.

Figure 9A:
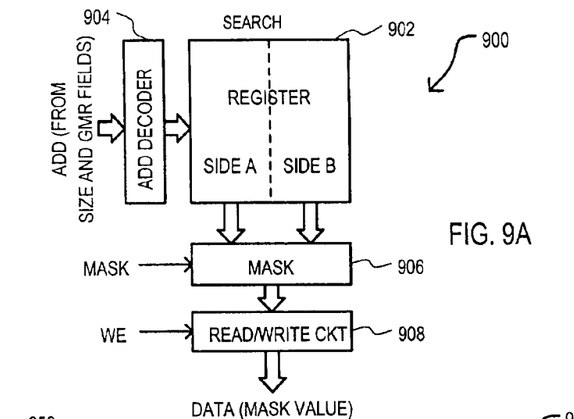
FIGS. 9A to 9D are various block and schematic diagrams illustrating a search operation according to one embodiment.
Figure 9B:
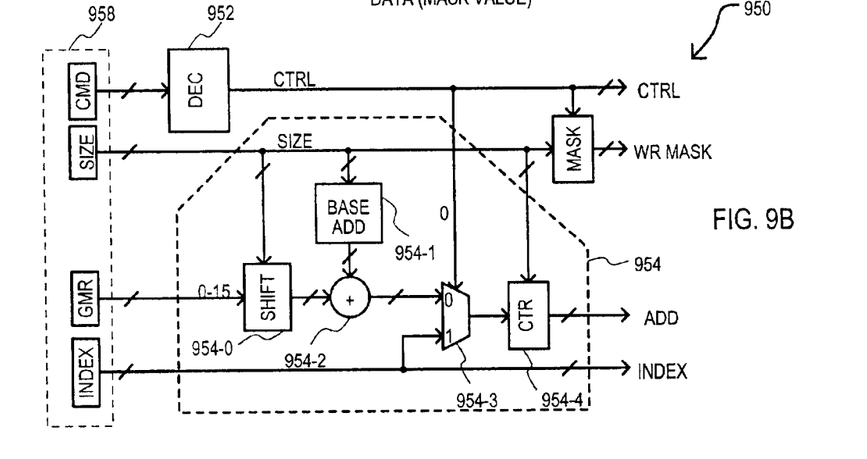

A search operation will now be described with reference to FIGS. 9A to 9D. FIGS. 9A and 9B may include the same general items as FIGS. 9A and 9B. To that extent, like items will be referred to by the same reference character but with the first digit being an "9" instead of a "7."

Figure 9C:
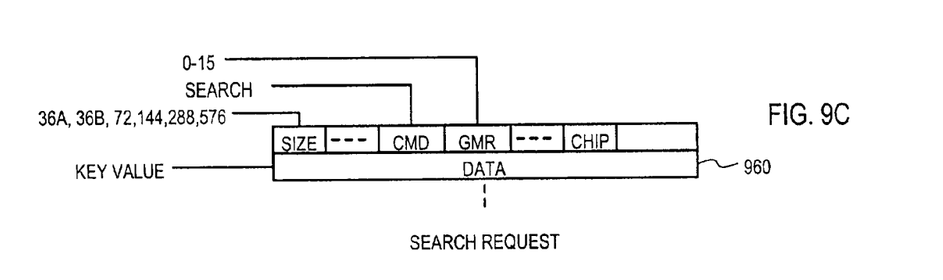

FIG. 9C shows a search request 960 according to an embodiment. A search request may include various fields previously described, including a size field SIZE, a command field CMD, and a device ID field CHIP. In addition, a search request 960 may also include a mask register field GMR. A mask register field GMR may identify a particular mask value in a given region. More particularly, if reference is made back to FIG. 5, it will be recalled that the various regions may each store up to sixteen mask values. Thus, a mask register field GMR may have a value of 0–15 that can indicate a particular mask value in a region.

A search request 960 may also include one or more data fields that store a key value.

Figure 9D:
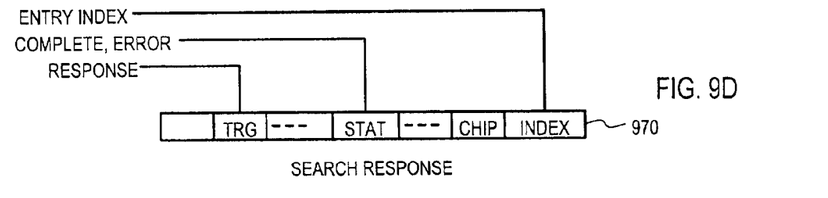

Referring now to FIG. 9D, a search response 970 may have various fields, including a target field TRG, a status field STAT, a device ID field CHIP, and an index field INDEX. A target field TRG may identify a response as a response, and a status field STAT may indicate if a corresponding search request 960 was successful. A device ID field CHIP may be the same as previous examples. An index field INDEX may store a search result value.

Referring now to FIGS. 9A to 9D, a search operation will now be described. A search request 960 may be received from a requesting device, or the like. A size field SIZE may indicate a particular size of a key and corresponding mask. A command field CMD may indicate a search operation. A mask register field GMR may indicate one mask value from a particular region. In the example of FIGS. 9A–9D a mask register field may store a value from 0–15.

Upon receiving a search request 960, a CAM device may store values from a command field CMD, a size field SIZE, and a mask register field GMR in corresponding locations of a request store 958.

A command decoder 952 may decode a search command to generate control signals CTRL. Control signals CTRL can enable a path from an adder 954-2 through MUX 954-3.

In addition, a size value SIZE, can control the operation of a shift circuit 954-0, a base address generator 954-1, and a counter 954-4. In response to a size value, a shift circuit 954-0 may (or may not) shift a mask register value (0–15) to thereby generate an offset address for a region of a mask register set.

A size value SIZE may also enable a base address generator 954-1 to generate a base address of a corresponding region in a mask register set. A base address may be added to an output from shift circuit 954-0 within an adder 954-2. A resulting address may be input to MUX 954-3.

A MUX 954-3 may output such an address to counter circuit 954-4. Counter circuit 954-4 may output such an address. If a size is large enough, counter circuit may also generate a sequence of additional addresses by incrementing a received address.

In this way, a mask value may be read from a mask register set according to a mask size value and mask register value.

It is understood that while particular circuit structures have been described herein, such structures should not be construed as necessarily limiting the invention thereto. One skilled in the art could arrive at various alternative circuits to perform indicated functions.

Along these same line, while the above examples have showed particular examples of registers of width 8*9 (a total of 72 bits), register widths may be based on other base unit sizes.

Thus, while the embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A method for storing mask values in a content addressable memory (CAM), comprising the steps of:
    storing at least one mask value according to a mask size in a register set having a plurality of locations arranged into at least two regoins for storing mask values of different predetermined sizes; and
    storing mask values of size N in one region and size $N*2^1$ in another region, where I is number greater than zero.

2. The method of claim 1, further including:
    storing the at least one mask value in a portion of a mask register set location according to a portion identification (ID) value.

3. The method of claim 1, further including:
    storing the at least one mask value in multiple mask register set locations for mask values having sizes greater than a single mask register set location width.

4. The method of claim 1, further including:
    storing a mask value of a first size in a first region and storing a mask value of second size in a second region that overlaps the first region.

5. The method of claim 1, further including:
    receiving a mask write request that includes at least a mask value having a mask size.

6. A method of retrieving mask values in content addressable memory (CAM) device, comprising the steps of:
    retrieving at least one mask value from one of a plurality of mask register set regions that each store mask values of different predetermined sizes; and
    receiving a search request that includes a mask size value and mask register value that identifies a mask value in a mask register set region.

7. The method of claim 6, wherein:
    retrieving at least one mask value includes accessing only one location from a first region to retrieve a mask value of a first size.

8. The method of claim 7, wherein:
    retrieving at least one mask value further includes accessing only one location from a second region to retrieve a mask value of a second size that is different than the first size.

9. The method of claim 6, wherein:

retrieving at least one mask value further includes accessing a plurality of locations from a third region to retrieve a mask value of a third size.

10. The method of claim 6, further including:

receiving a read mask request that includes at least one mask register set location corresponding to the at least one mask value.

11. The method of claim 6, further including:

applying a portion of the at least one mask value in a compare operation according to a portion identification (ID) value.

12. A content addressable memory (CAM) device, comprising:

a mask register set having at least two regions pre-designated to store different size mask values, wherein at least two regions include a first region for storing mask values of a first size, a second region for storing mask values of a second size different than the first size, and a third region that overlaps at least the first region for storing mask value of a third size different than the first and second sizes.

13. The CAM device of claim 12, wherein:

at least one of the at least two regions includes locations for storing at least two mask values in a single location.

14. The CAM device of claim 12, wherein:

the at least two regions includes a first region for storing mask values of size N, and a second region for storing mask values of size $N*2^I$, where I is a number greater than zero.

15. The CAM device of claim 12, wherein:

the at least two regions includes at least four regions for storing mask values of four different sizes.

16. The CAM device of claim 12, further including:

a request store having regions for storing values selected from the group of a size value that indicates a size of a mask value, a command value that indicates a particular CAM operation, a mask register value that identifies a particular mask value in a region of a mask register set, a device identification value that identifies a CAM device, and an index value that can store a mask register act address.

17. The CAM device of claim 12, further including:

a CAM array coupled to the mask register set, the CAM array including a plurality of entries that store data values for comparison with a comparand value.

18. A content addressable memory (CAM) comprising:

a set of associated registers configured according to a search command type, and configured uniquely for each of a plurality of search widths; wherein the search widths are selected from the group consisting of 8n and 9n bits, n being an integer of at least 1.

19. The CAM device of claim 18, wherein:

the search widths are selected from the group consisting of 8, 9, 16, 18, 32, 36, 64, 72, 128, 144, 256, 288, 512 and 576 bits.

* * * * *